United States Patent
Wan

(10) Patent No.: US 7,745,804 B1
(45) Date of Patent: Jun. 29, 2010

(54) ION IMPLANTATION METHOD AND APPLICATION THEREOF

(75) Inventor: Zhimin Wan, Sunnyvale, CA (US)

(73) Assignee: Advanced Ion Beam Technology, Inc., San Jose, CA (US)

( * ) Notice: Subject to any disclaimer, the term of this patent is extended or adjusted under 35 U.S.C. 154(b) by 0 days.

(21) Appl. No.: 12/371,182

(22) Filed: Feb. 13, 2009

(51) Int. Cl.
*H01J 37/317* (2006.01)
*H01L 21/265* (2006.01)

(52) U.S. Cl. .............. 250/492.21; 250/442.11; 250/492.3; 73/864.91

(58) Field of Classification Search .......... 250/492.21, 250/442.11, 492.3; 73/864.91
See application file for complete search history.

(56) References Cited

U.S. PATENT DOCUMENTS

| | | | | |
|---|---|---|---|---|
| 5,929,456 A * | 7/1999 | Tamai | | 250/492.21 |
| 6,806,479 B1 * | 10/2004 | Wan et al. | | 250/492.21 |
| 6,918,351 B2 * | 7/2005 | Chen et al. | | 118/723 CB |
| 2004/0149926 A1 * | 8/2004 | Purser et al. | | 250/397 |

* cited by examiner

*Primary Examiner*—Nikita Wells
(74) *Attorney, Agent, or Firm*—Muncy, Geissler, Olds & Lowe, PLLC

(57) ABSTRACT

An ion implantation method for achieving angular uniformity throughout a workpiece and application thereof are provided. The ion beam has at least one beamlet striking the workpiece surface with corresponding incident angles. The workpiece is mapped to an imaginary planar coordinate system. The incident angle of a center beamlet of the ion beam has a projection on the coordinate system forming a projection angle with an axis thereof. A workpiece orientation of the workpiece is adjusted based on the projection angle such that the contribution of each beamlet to the overall ion beam intensity upon striking the workpiece surface is rendered substantially the same from respective directions of each of the coordinate axes.

20 Claims, 9 Drawing Sheets

ION IMPLANTATION METHOD AND APPLICATION THEREOF

BACKGROUND OF THE INVENTION

1. Field of the Invention

The present invention relates to an ion implantation method, and more particularly, to an ion implantation method for achieving angular uniformity throughout a workpiece being implanted, and application thereof.

2. Background of the Related Art

Ion implantation is a material engineering process by which ions of a material can be implanted into another solid, thereby changing the physical properties of the solid. Ion implantation is used in semiconductor device fabrication. Referring to FIG. 1, which is a schematic illustration of an ion implantation system 100 in accordance with the conventional art. The ion implantation system 100 comprises an ion beam source 110, a workpiece 120 to be implanted, and a workpiece holder (not shown). An ion beam 130 is generated and directed by the ion beam source 110 to the surface of the workpiece 120. The workpiece holder may be designed that during the implantation the workpiece 120 is allowed for both a linear motion and a rotational motion, as indicated by arrows 140 and 150.

Referring to FIG. 2, which is a schematic illustration of ion implantation operation in accordance with the conventional art. An ion beam 210 is directed to strike the surface of a workpiece 220. The ion beam 210 may comprise at least one beamlet 230 (including a center beamlet 231). A beam spot 211 is formed on the workpiece surface 220 by individual beamlets 230 hitting on the workpiece surface 220. Each beamlet 230 may strike the workpiece surface 220 with a corresponding incident angle 240. The incident angle 240 is an angle between the incoming beamlet 230 and the normal (indicated by the dotted line 221) to the workpiece surface 220. It is noted that in this example the center beamlet 231 is in parallel with the normal 221 to the workpiece surface 220, which is not necessary. It is also noted that the beamlet 230 is depicted a straight line merely for convenience of illustration, in reality they are mostly curved lines except for the center beamlet 231.

In ion implantation, it is important to control the beamlet incident angle 240 because the implantation depth is generally a function of the incident angle 240 as a result of the well-known channeling effect. Further, it is sometimes necessary to perform the implantation at certain incident angles 240 in order to conform to the geometry of the device being manufactured.

In semiconductor device fabrication, the wafer dose uniformity and angular uniformity are critical to the electrical characteristics of the products. To achieve the dose uniformity throughout a workpiece being implanted, numerous implantation methods have been proposed, such as the continuous rotation-implantation approach which alternately performs rotation and implantation of the target workpiece such that when the implantation process is complete, a dose uniformity throughout the workpiece is achieved.

While it is possible to design beam transport optics which are nearly aberration-free, the beam characteristics such as angular divergence is nonetheless still determined to a great extent by the emittance properties of the ion source. A divergent beam is oftentimes fetal to the angular uniformity of the implanted workpiece in ion implantation. Therefore, an implantation method capable of achieving the angular uniformity with the limited ability of current system hardware is desired.

SUMMARY OF THE INVENTION

In order to solve the foregoing problems, one feature of this invention is to provide an ion implantation method for achieving angular uniformity throughout a workpiece being implanted.

One embodiment of the present invention provides an ion implantation method for achieving angular uniformity throughout a workpiece being implanted, comprising: providing an ion beam comprising at least one beamlet, wherein each of the beamlets strikes the workpiece surface with a corresponding incident angle whereby contributing to the overall intensity of the ion beam upon striking the workpiece surface; mapping the workpiece to an imaginary planar coordinate system having a first axis along a first direction and a second axis along a second direction, wherein the beamlet's contribution to the ion beam intensity is composed of a component from the first direction and the second direction; implanting the workpiece using the ion beam; rotating the workpiece by an angle of p degrees around an axis perpendicular to both the first direction and second direction; and repeating the implantation and rotation steps (n-1) times such that the product of n and p (n×p) is equal to 360 degrees thereby completing the ion implantation process. For each implantation step, the contribution to the overall ion beam intensity by each beamlet at its incident angle is rendered substantially the same from the first and second direction.

In one embodiment, in order to render the beamlet's contribution to the ion beam intensity substantially the same from the first and second direction, a workpiece orientation of the workpiece is adjusted before the implantation-rotation repeating cycle. The adjustment is based on a projection angle which is formed by the projection of a center beamlet's incident angle on the coordinate system and the first axis. If the projection angle is equal to 0, 90, 180 or 270 degrees including multiples thereof, the workpiece is rotated around an axis perpendicular to both the first and second direction such that the workpiece orientation changes by an angle within one of the following ranges, or any combination thereof: 30 to 60 degrees, 120 to 150 degrees, 210 to 240 degrees, or 300 to 330 degrees. If the projection angle is any angle between 0 and 90 degrees (not including 0 and 90 degrees) except for 45 degrees, any angle between 90 and 180 degrees (not including 90 and 180 degrees) except for 135 degrees, any angle between 180 and 270 degrees (not including 180 and 270 degrees) except for 225 degrees, or any angle between 270 and 360 degrees (not including 270 and 360 degrees) except for 315 degrees, the workpiece is rotated around the axis such that the workpiece orientation changes by an angle of the projection angle plus an angle within one of the following ranges, or any combination thereof: 30 to 60 degrees, 120 to 150 degrees, 210 to 240 degrees, or 300 to 330 degrees. Further, if the projection angle is equal to 45, 135, 225, or 315 degrees, then the workpiece orientation is left unchanged.

In another embodiment of the present invention, an ion implanter is provided. The provided ion implanter at least comprises an ion beam source, a workpiece holder which holds a workpiece to be implanted, and a control module. The control module is coupled with the ion beam source and the workpiece holder. The control module comprises a computer readable medium encoded with a computer program which is implemented to perform the proposed ion implantation method. The computer program executes actions comprising: instructing the ion beam source to provide an ion beam, mapping the workpiece to an imaginary planar coordinate system, instructing the workpiece holder to adjust the workpiece orientation of the workpiece, instructing the ion beam source to work with the workpiece holder thereby implanting the workpiece, and instructing the workpiece holder to rotate the workpiece by an angle of p degrees, wherein the workpiece implantation and rotation steps are repeated (n-1) times until the product of n and p is equal to 360 degrees.

DETAILED DESCRIPTION OF THE INVENTION

Figure 3:
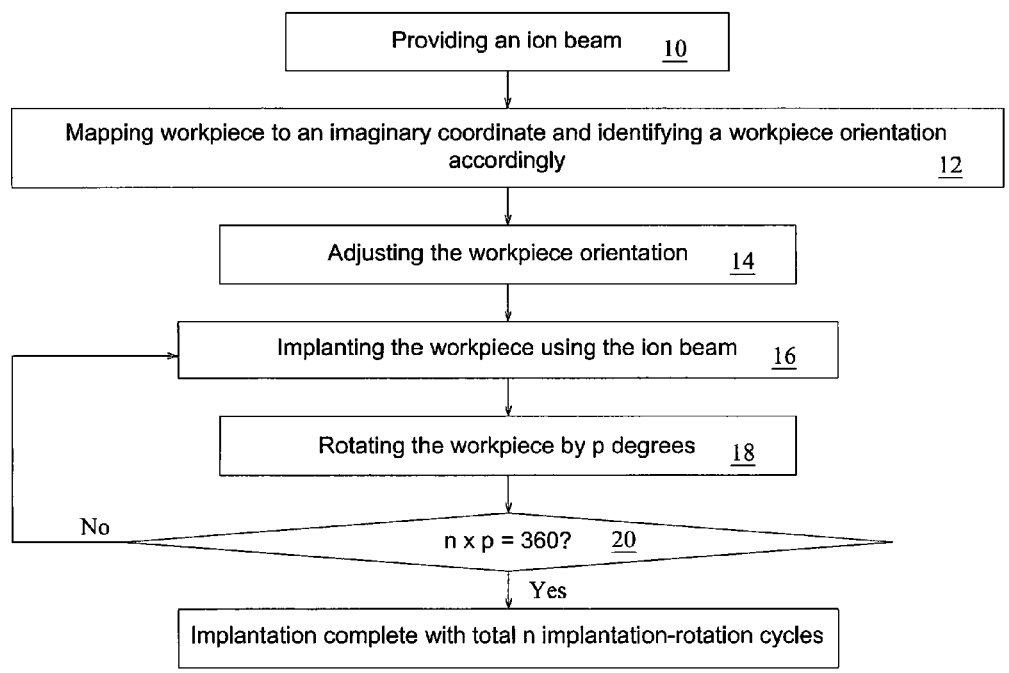
FIG. 3 is a flow chart illustration of an ion implantation method in accordance with an embodiment of the present invention.

FIG. 3 is a flow chart illustrating an ion implantation method for achieving angular uniformity throughout a workpiece in accordance with an embodiment of the present invention. The workpiece may be a semiconductor wafer. The provided ion implantation method comprises the following steps.

In step 10, an ion beam comprising a plurality of beamlets is provided, wherein each of the beamlets strikes a workpiece surface with a corresponding incident angle whereby contributing to the overall intensity of the ion beam upon striking the workpiece.

In step 12, the workpiece is mapped to an imaginary planar coordinate system having a first axis along a first direction and a second axis along a second direction, and the workpiece plane overlaps the coordinate system. It is noted that in one embodiment, step 10 and 12 are swappable.

Figure 1:
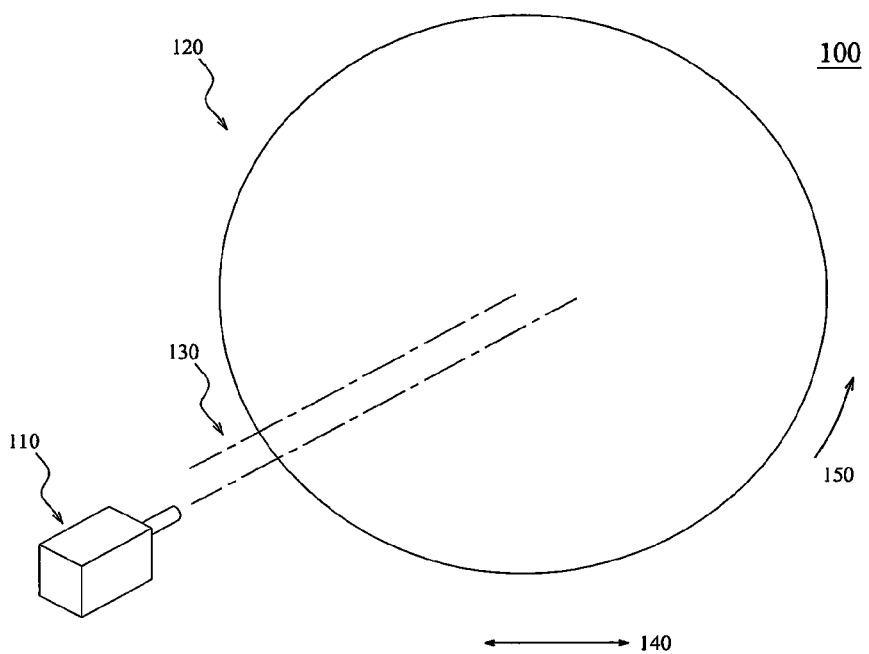
FIG. 1 is a schematic illustration of an ion implantation system in accordance with the conventional art.
Figure 2:
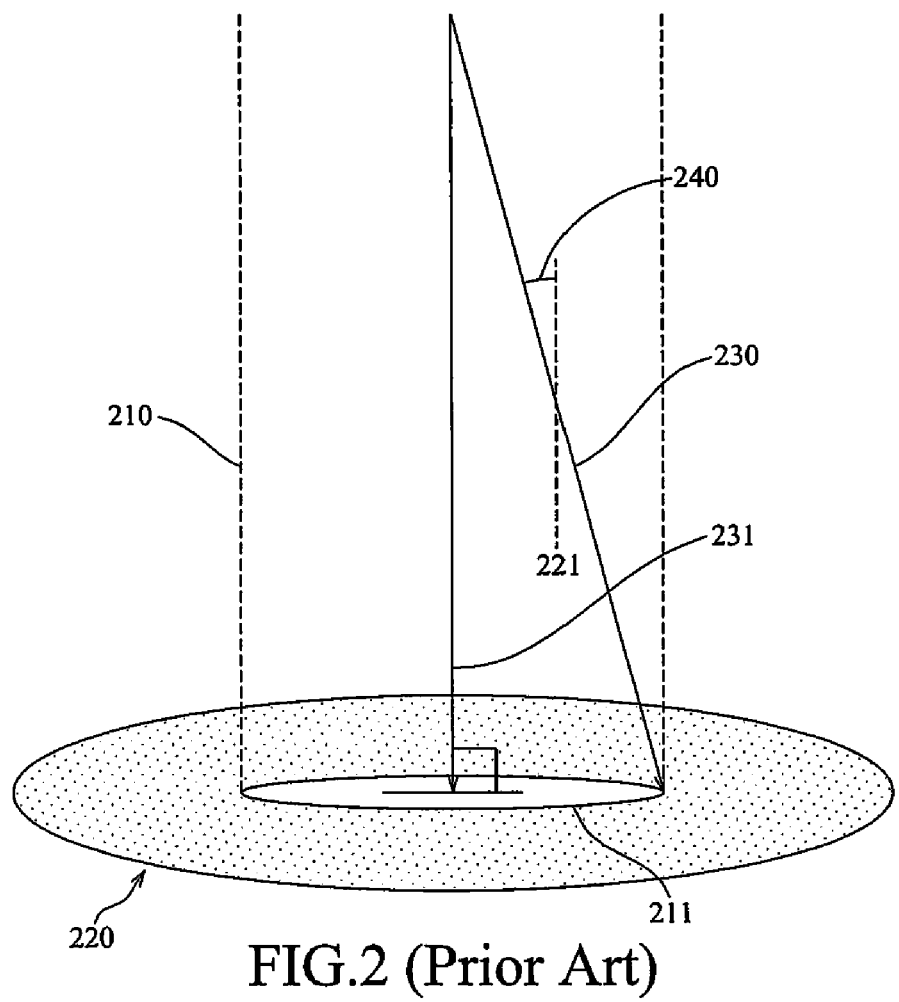
FIG. 2 is a schematic illustration of ion implantation operation in accordance with the conventional art.
Figure 4:
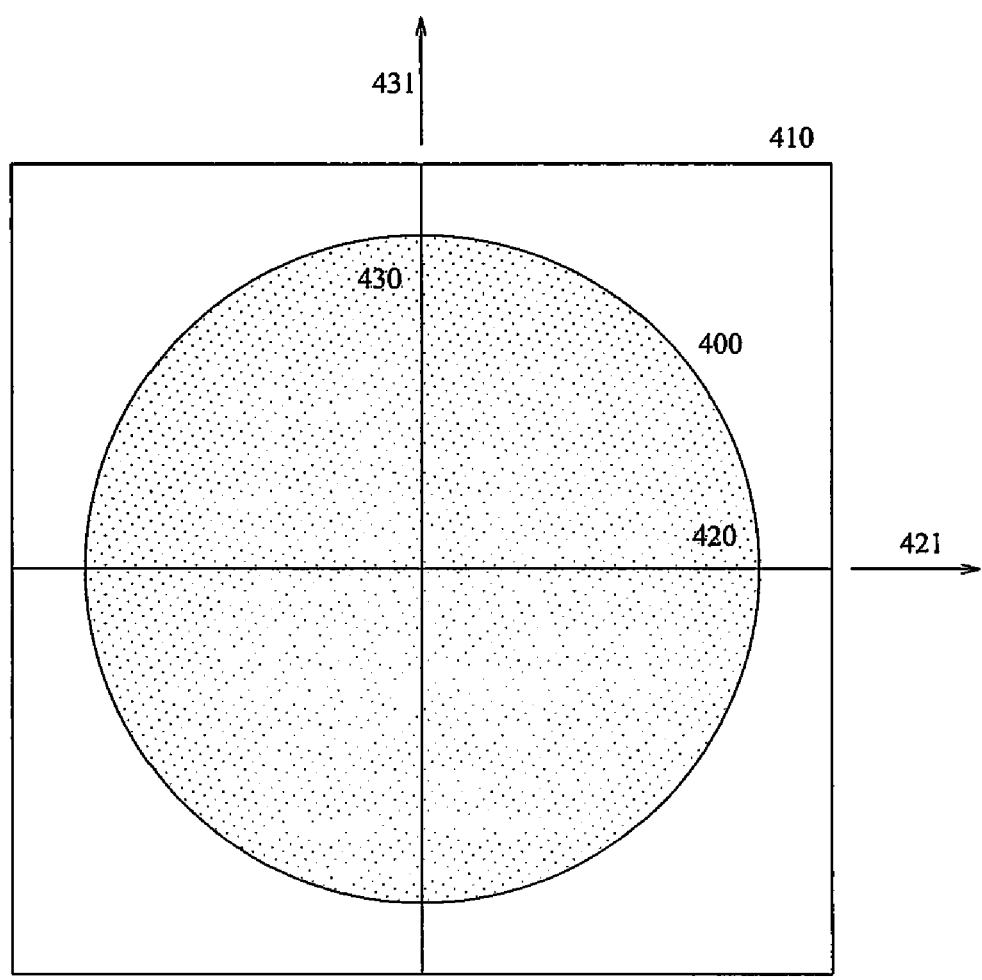
FIG. 4 is a schematic illustration of mapping a workpiece to an imaginary planar coordinate system in accordance with an embodiment of the present invention.

Reference will now be temporarily made to FIG. 4 for a schematic illustration of mapping the workpiece to an imaginary planar coordinate system in accordance with an embodiment of the present invention. A workpiece 400 is mapped to an imaginary coordinate system 410 with a first axis 420 along a first direction 421 and a second axis 430 along a second direction 431. As shown, in this example the first direction 421 and the second direction 431 are perpendicular each other. The imaginary planar coordinate system 410 is selected such that the incident angle of the beamlet illustrated in FIG. 1 can be projected on it through proper mathematic transformation. For example, a horizontal direction is usually selected as the first direction, and a vertical direction as the second direction, since a beamline analyzer magnet dispersive plane is usually along the horizontal direction (or say the ion beam is steered from the ion source along the horizontal plane toward the workpiece). When an ion beam is steered by the analyzer magnet so that the ion beam is not striking the workpiece perpendicularly, the ion beam projection on this planar coordinate system is along the first direction. However, if the workpiece is rotated a certain angle of for example "A" degrees around an axis perpendicular to both the first and second direction, the planar coordinate system is also rotated, so that the ion beam projection is no longer along the first direction but a direction between the first and second direction with "A" degrees from the first direction.

Figure 5:
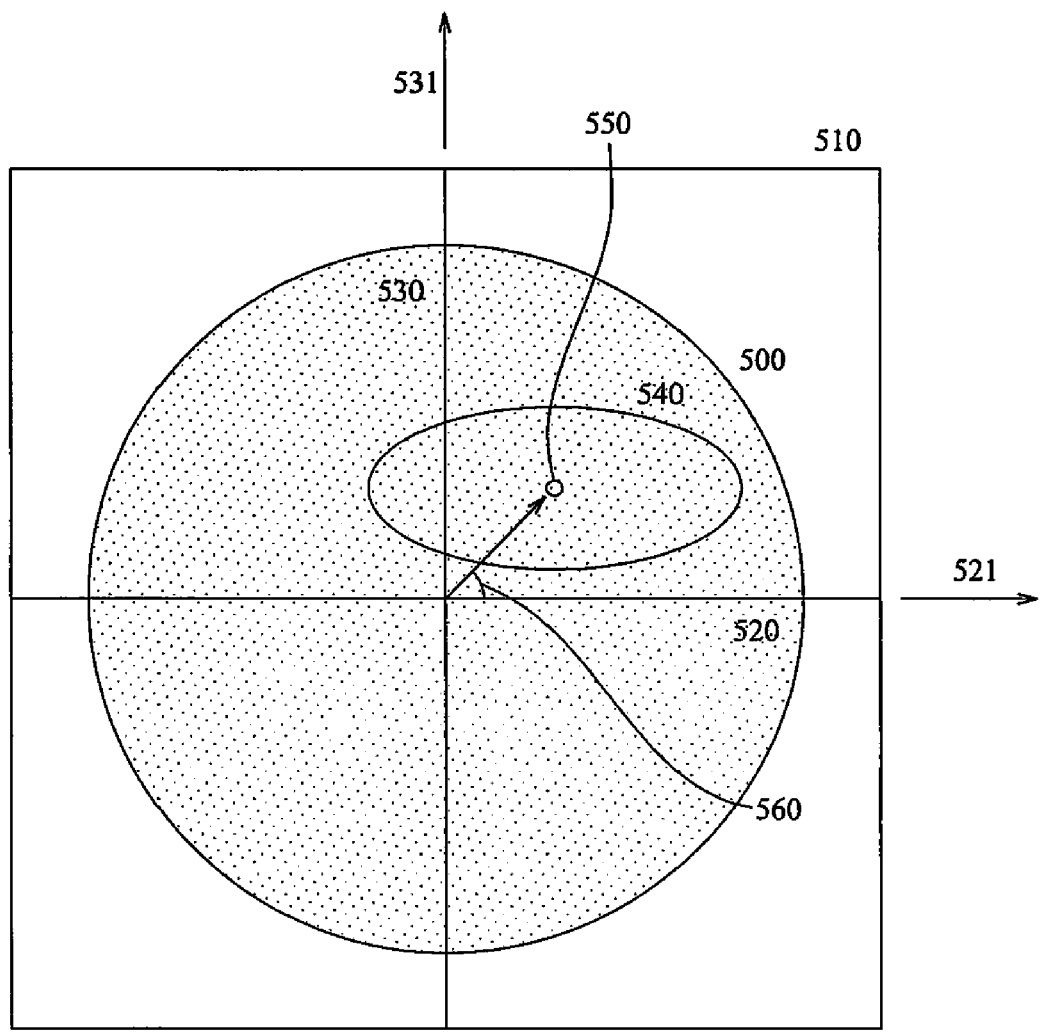
FIG. 5 is a schematic illustration of projecting the beamlet incident angle on an imaginary planar coordinate system in accordance with an embodiment of the present invention.

Reference will now be temporarily made to FIG. 5, which is a schematic illustration of projecting the beamlet incident angle on the imaginary coordinate system. As shown, a workpiece 500 is mapped to an imaginary planar coordinate system 510 with a first axis 520 along a first direction 521 and a second axis 530 along a second direction 531. An implanting beam is projected on the coordinate system 510, forming a beam profile 540 thereon. The beam profile 540 is formed by projecting the incident angle of individual beamlets in the ion beam onto the planar coordinate system 510. It is noted that each beamlet strikes the workpiece with its corresponding incident angle. Among these beamlet projections, the one of a center beamlet of the ion beam is used to define a projection angle of the ion beam on the imaginary planar coordinate system 510. The center beamlet is selected to represent the whole ion beam in defining the projection angle because it is typically not divergent. To define the projection angle, the projection of the incident angle of the center beamlet (550) is given a vector form the origin of the planar coordinate system 510. The coordinate of this vector, which indicates the angular distance between the projection 550 and the first axis 520, then represents the projection angle 560 of the concerned ion beam on the coordinate system 510. If the projection angle 560 is equal to 0 degree, the incident angle projection of the center beamlet falls on the first axis 520.

Figure 6A:
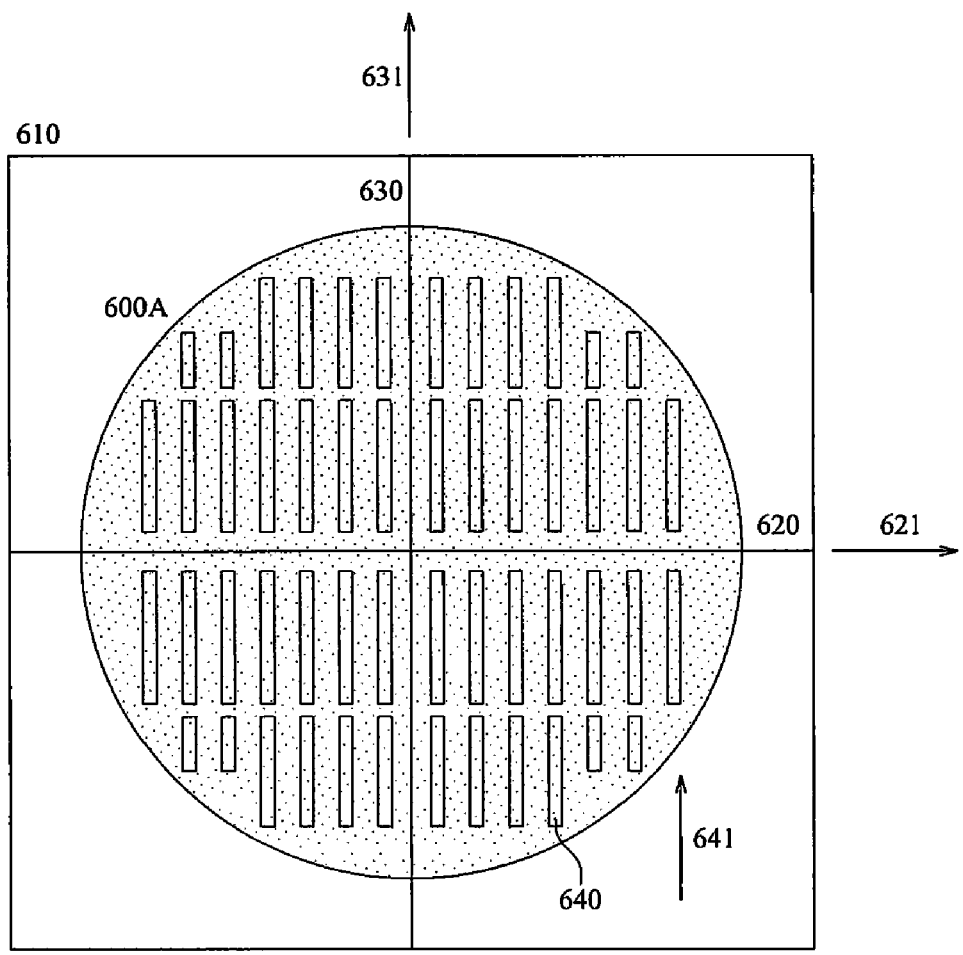
FIG. 6A is a schematic illustration of a workpiece orientation in accordance with an embodiment of the present invention.

At the beginning of ion implantation, the workpiece may have a predefined workpiece orientation. Reference will now be temporarily made to FIG. 6A, which is a schematic illustration of the workpiece orientation in accordance with an embodiment of the present invention. As shown, a workpiece 600A is mapped on an imaginary coordinate system 610 with a first axis 620 along a first direction 621 and a second axis 630 along a second direction 631. The workpiece 600A has designed pattern devices 640 (such as transistors, electrically conductive wires, contact plugs, etc.) thereon. In such case, the workpiece orientation of the workpiece 600A can be defined according to an orientation of the pattern devices 640. For example, as illustrated the workpiece orientation 641 of workpiece 600A is set to be along the long edge of the pattern devices 640, which is in parallel with the second direction 631.

Figure 6B:
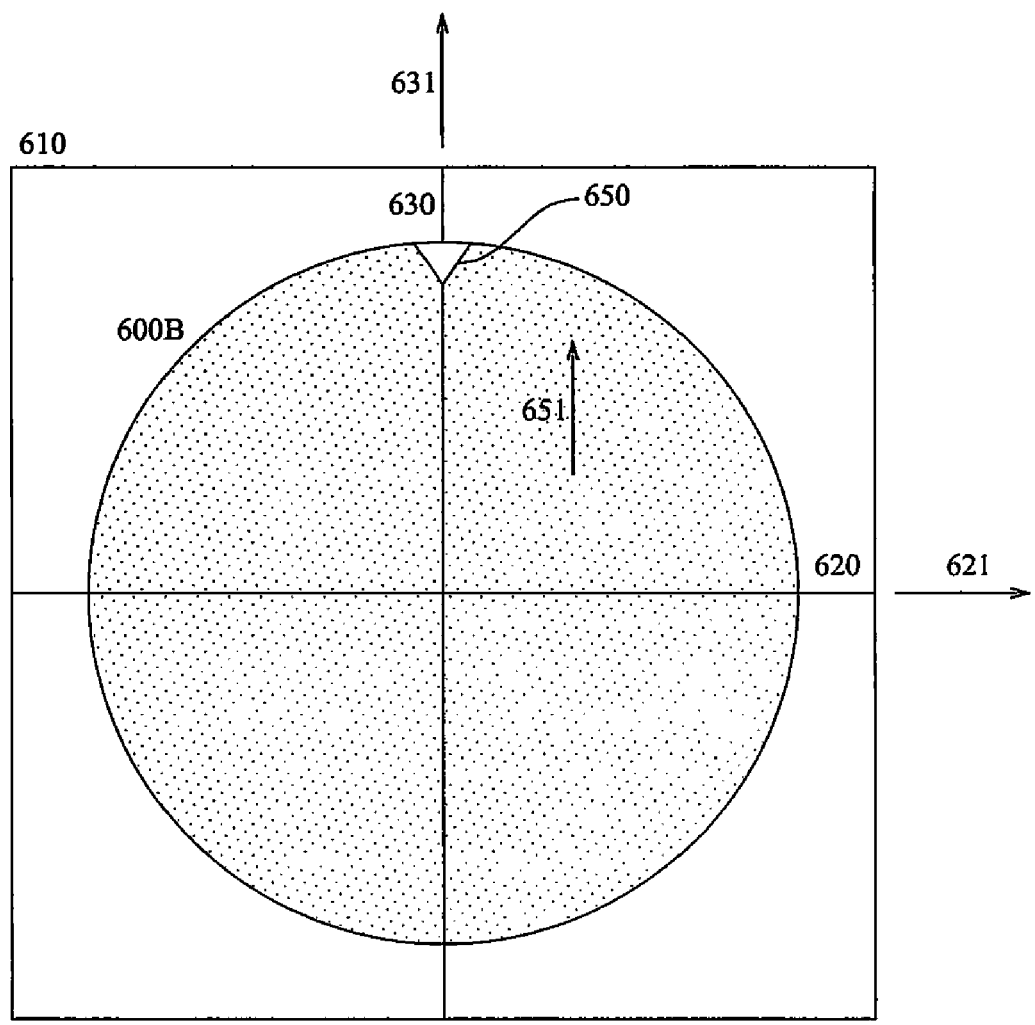
FIG. 6B is a schematic illustration of a workpiece orientation in accordance with an embodiment of the present invention.

Further, referring to FIG. 6B, a schematic illustration of the workpiece orientation in accordance with another embodiment of the present invention, in which a workpiece 600B is mapped to the same imaginary coordinate system 610. Workpiece 600B has a notch 650 thereon for the purpose of correct handling of the workpiece 600B. For example, the notch 650 may help to grasp the workpiece 600B from a correct angle for transfer of the workpiece 600B between different fabrication stages. In such case, a workpiece orientation of workpiece 600B can be defined based on the orientation of the notch 650. As shown in FIG. 6B, for example the workpiece orientation 651 of workpiece 600B is set to pointing at the opposite direction of the notch tip, which is along the second direction 631. It is noted that in the examples in FIGS. 6A and 6B, the respective workpiece orientations 641 and 651 are selected to be perpendicular to the first axis 620 at the beginning of the implantation process for convenience of operation.

Reference will now be made back to FIG. 3. In step 14, the workpiece orientation is adjusted based on the found projection angle. For example, if the projection angle is equal to 0° (including 360°, 90°, 180° or 270°, then the workpiece is rotated around an axis perpendicular to both the first direction and second direction such that the workpiece orientation changes by an angle T. In one embodiment, the angle T falls within one of the following ranges, or any combination thereof: 30° to 60°, 120° to 150°, 210° to 240°, or 300° to 330°. In one embodiment, T is selected to be one of the following angles, or any combination thereof: 45°, 135°, 225°, or 315°.

On the other hand, if the projection angle is any angle between 0° and 90° (not including 0° and 90° except for 45°, any angle between 90° and 180° (not including 90° and 180° except for 135°, any angle between 180° and 270° (not including 180° and 270° except for 225°, or any angle between 270° and 360° (not including 270° and 360° except for 315°, then the workpiece is rotated around the above axis such that the workpiece orientation changes by an angle T of T=P0+P0', wherein P0 is the projection angle, P0' is within one of the following ranges, or any combination thereof: 30° to 60°, 120° to 150°, 210° to 240°, 300° to 330°. In one embodiment P0' is selected to be one of the following angles, or any combination thereof: 45°, 135°, 225°, or 315°. Further, if the projection angle is equal to 45, 135, 225, or 315 degrees (including multiples thereof), then the workpiece orientation is left unchanged.

Then, in step 16, the provided ion beam is used to implant the workpiece. It is noted that the overall intensity of the provided ion beam upon striking the surface of the workpiece is a combination of a contribution from individual beamlet at its incident angle. In this embodiment, such contribution can be further decomposed into a component from the first and second direction, respectively, and by adjusting the workpiece orientation in step 14, during implantation each beamlet's contribution to the ion beam intensity is rendered substantially the same from the first and second direction. It is noted that to achieve this goal, other implantation skills may be used as alternatives of the present invention and should not be used to limit the scope of the present invention, which is to be determined by the claims.

Next, in step 18, the workpiece is rotated by an angle of p degrees around an axis perpendicular to both the first and second axis. This rotation step 18, along with the implantation step 16, are then alternately repeated (n-1) times (starting with the implantation step 16) until the product of n and p is equal to 360 degrees (i.e. n×p=360°. In one embodiment, n can be an integer equal or greater than 2.

As shown in FIG. 3, step 18 is followed by a judging step 20 for judging the product of n and p. If it is judged that (n×p) is not equal to 360°, then the process proceeds back to step 16 and down. If it is judged that (n×p) is equal to 360°, then the ion implantation is determined to be complete. In one embodiment, the workpiece is rotated three more times (i.e. n=4) and in each rotation the workpiece is rotated by an angle of ninety degrees) (p=90°. In such example, the rotation-implantation repeating cycle is performed four times in total to complete the ion implantation process. And, as mentioned earlier, when the implantation process is complete, a dose uniformity is achieved throughout the workpiece.

Figure 7:
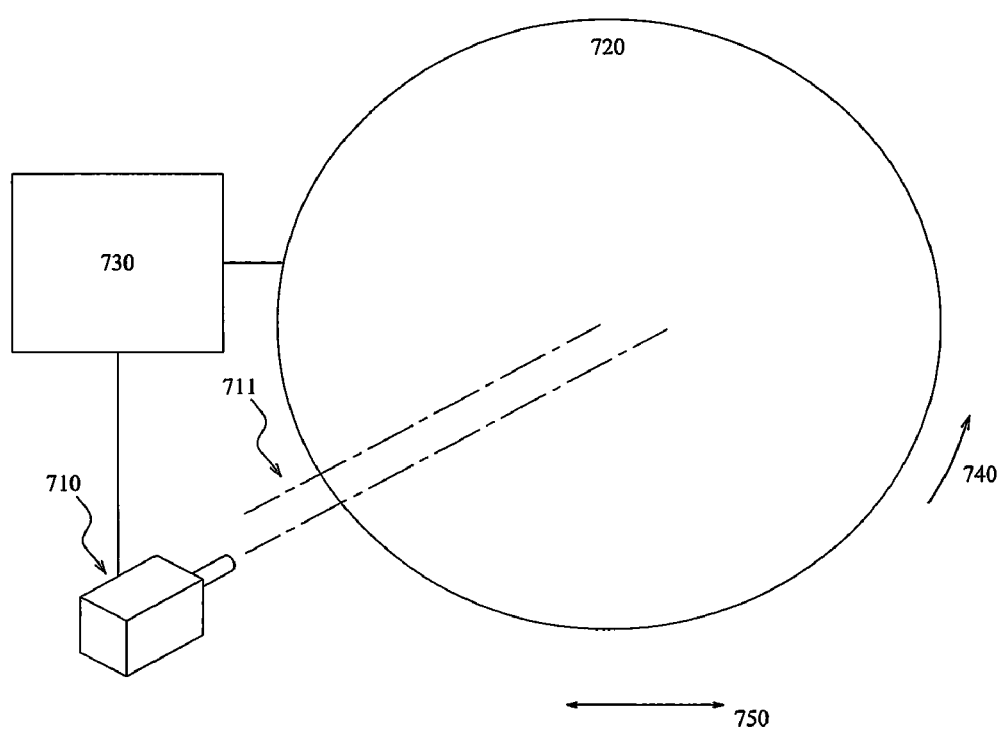
FIG. 7 is a schematic illustration of an ion implanter in accordance with an embodiment of the present invention.

Referring to FIG. 7, in one embodiment of the present invention, an ion implanter 700 is provided. The provided ion implanter 700 at least comprises an ion beam source 710 which emits an ion beam 711, a workpiece holder (not shown) which holds a workpiece 720 to be implanted, and a control module 730. Ion beam 711 comprises a plurality of beamlets, wherein each of the beamlets strikes the surface of workpiece 720 with a corresponding incident angle whereby contributing to the overall intensity of the ion beam 711 upon striking the workpiece surface. The workpiece holder allows the workpiece 720 a rotational motion, as illustrated by the arrow 740. Optionally, the workpiece holder may also allow the workpiece 720 a linear motion as illustrated by arrow 750. A workpiece orientation is predefined for the workpiece 720 at the beginning of implantation. The control module 730 is coupled with the ion beam source 710 and the workpiece holder. The control module 730 comprises a computer readable medium encoded with a computer program which is designed for achieving angular uniformity throughout the workpiece during ion implantation. For example, this computer program may be designed to be an implementation of the implantation methods described in previous embodiments of the present invention.

Figure 8:
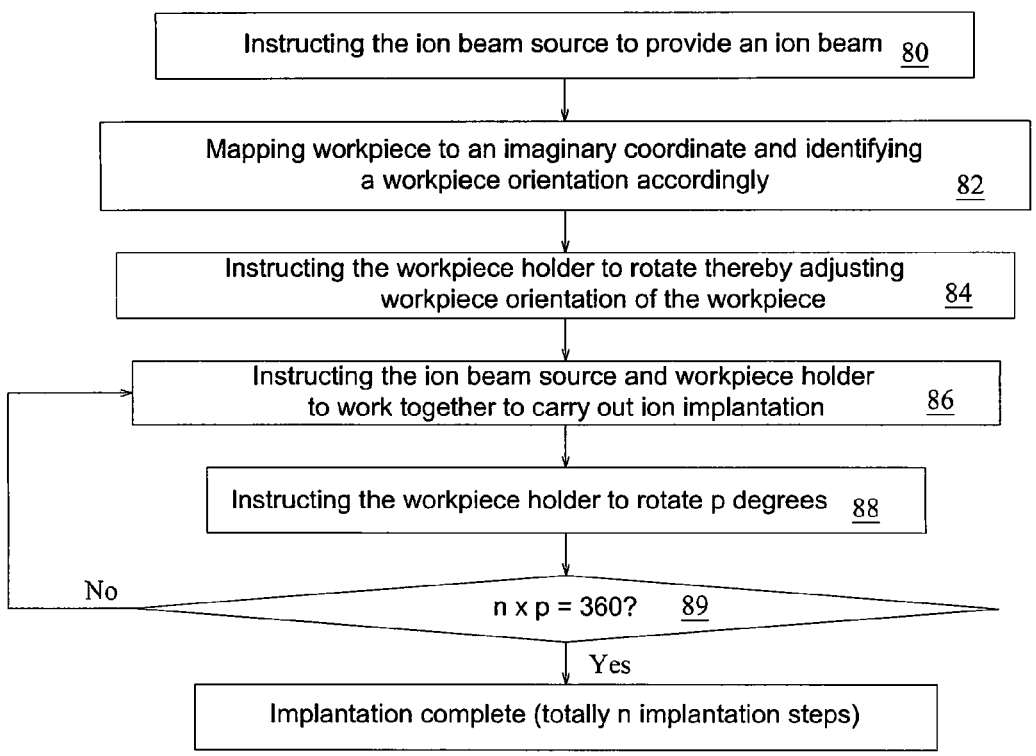
FIG. 8 is a flowchart illustrating the execution of a computer program in accordance with an embodiment of the present invention.

Reference will now be temporarily made to FIG. 8, which is a flowchart illustrating the execution of the computer program described in conjunction with FIG. 7 in accordance with an embodiment of the present invention. In step 80, the ion beam source 710 is instructed by the program to provide the ion beam 711.

Then, in step 82, the workpiece 720 is mapped to an imaginary planar coordinate system having a first axis along a first direction and a second axis along a second direction. The incident angle of a center beamlet of the ion beam 711 is projected on the coordinate system to form a projection thereon, which forms a projection angle with the first axis. Moreover, the predefined workpiece orientation of workpiece 720 is identified and recorded for subsequent use. It is noted that step 82 may be implemented in a firmware such as an embedded computing device, or pure software. It is also noted that in one embodiment, step 80 and step 82 are swappable.

In step 84, the workpiece holder is instructed to rotate such that the workpiece orientation of workpiece 720 is adjusted based on the formed projection angle. The principals of the adjustment can be referred to those embodiments previously described in conjunction with FIG. 3, and will not be repeated here.

In step 86, the ion beam source 710 and the workpiece holder are instructed to work together to match the relative motion of the ion beam 711 and the workpiece 720, so as to carry out the ion implantation of the workpiece 720 using the ion beam 711.

Next, in step 88, the workpiece holder is instructed to rotate such that the workpiece 720 is rotated by an angle of p degrees around an axis perpendicular to both the first and second axis, and then the workpiece implantation and rotation step (step 86 and 88) are alternately repeated (n-1) times (starting with the implantation step 86) until the product of n and p (n×p) is equal to 360 degrees. This is done by an implementation of a judging step 89 as illustrated. In step 89, if it is judged that (n×p) is not equal to 360°, then the process proceeds back to step 86 and down. On the hand, if it is judged that (n×p)=360°, then it is determined that the ion implantation is complete.

In an embodiment, the first direction and the second direction are perpendicular each other. In another embodiment, n is an integer equal to or greater than 2.

Although the present invention has been explained in relation to its preferred embodiment, it is to be understood that other modifications and variation can be made without departing the spirit and scope of the invention as hereafter claimed.

What is claimed is:

1. An ion implantation method for achieving angular uniformity throughout a workpiece being implanted, comprising:
    providing an ion beam comprising at least one beamlet and mapping said workpiece to an imaginary planar coordinate system, wherein each of said beamlets strikes said workpiece surface with a corresponding incident angle whereby contributing to the intensity of said ion beam upon striking said workpiece, and said coordinate system has a first axis along a first direction and a second axis along a second direction;
    implanting said workpiece using said ion beam;
    rotating said workpiece by an angle of p degrees around an axis perpendicular to both said first direction and second direction; and
    repeating said implantation and rotation steps (n-1) times such that the product of n and p (n×p) is equal to 360 degrees thereby completing the ion implantation process,
    wherein for each implantation step, the contribution to said ion beam intensity by each said beamlet at its incident angle is rendered substantially the same from said first and second direction.

2. The method of claim 1, wherein said first and second directions are perpendicular to each other.

3. The method of claim 1, wherein when said ion implantation is completed, a dose uniformity is achieved throughout said workpiece.

4. The method of claim 1, wherein n is an integer equal to or greater than 2.

5. An ion implantation method for achieving angular uniformity throughout a workpiece being implanted, said workpiece having a predefined orientation at the beginning of ion implantation process, comprising:
    providing an ion beam comprising at least one beamlet and mapping said workpiece to an imaginary planar coordinate system,
        wherein each of said beamlets strikes said workpiece surface with a corresponding incident angle whereby contributing to the intensity of said ion beam upon striking said workpiece,
        wherein said coordinate system has a first axis along a first direction and a second axis along a second direction,
        wherein the incident angle of a center beamlet of said ion beam has a projection on said coordinate system, said projection forming a projection angle with said first axis;
    adjusting said workpiece orientation based on formed said projection angle;
    implanting said workpiece using said ion beam;
    rotating said workpiece by an angle of p degrees around an axis perpendicular to both said first direction and second direction; and
    repeating said implantation and rotation steps (n-1) times such that the product of n and p (n×p) is equal to 360 degrees thereby completing the ion implantation process.

6. The method of claim 5, wherein when said ion implantation is completed, a dose uniformity is achieved throughout said workpiece.

7. The method of claim 5, wherein said first and second directions are perpendicular to each other.

8. The method of claim 5, wherein said predefined workpiece orientation is on said coordinate system and perpendicular to said first axis.

9. The method of claim 5, wherein the step of adjusting said workpiece orientation comprises:
    if the quotient of said projection angle divided by 45 degrees is equal to an even integer, then rotating said workpiece around an axis perpendicular to both said first direction and second direction such that said workpiece orientation changes by an angle within one of the following ranges, or any combination thereof: 30 to 60 degrees, 120 to 150 degrees, 210 to 240 degrees, or 300 to 330 degrees;
    if the quotient of said projection angle divided by 45 degrees is equal to an odd integer, then leaving said workpiece orientation unchanged; and
    otherwise rotating said workpiece around an axis perpendicular to both said first direction and second direction such that said workpiece orientation changes by an angle of said projection angle plus an angle within one of the following ranges, or any combination thereof: 30 to 60 degrees, 120 to 150 degrees, 210 to 240 degrees, or 300 to 330 degrees.

10. The method of claim 5, wherein the step of adjusting said workpiece orientation comprises:
    if the quotient of said projection angle divided by 45 degrees is equal to an even integer, then rotating said workpiece around an axis perpendicular to both said first direction and second direction such that said workpiece orientation changes by 45, 135, 225 or 315 degrees, or any combination thereof;
    if the quotient of said projection angle divided by 45 degrees is equal to an odd integer, then leaving said workpiece orientation unchanged; and
    otherwise rotating said workpiece around an axis perpendicular to both said first direction and second direction such that said workpiece orientation changes by an angle of said projection angle plus 45, 135, 225 or 315 degrees.

11. The method of claim 5, wherein n is an integer equal to or greater than 2.

12. An implanter, comprising:
    an ion beam source for generating an ion beam, said ion beam comprising at least one beamlet, wherein each of said beamlets strikes said workpiece surface with a corresponding incident angle whereby contributing to the intensity of said ion beam upon striking said workpiece;
    a workpiece holder for holding a workpiece to be implanted, said workpiece having a predefined workpiece orientation at the beginning of implantation process, said workpiece holder allowing said workpiece a rotational motion;
    a control module coupled to said ion beam source and said workpiece holder, said control module comprising a computer readable medium encoded with a computer program, said program executing actions comprising:
        instructing said ion beam source to provide said ion beam;
        mapping said workpiece to a imaginary planar coordinate system having a first axis along a first direction and a second axis along a second direction, the incident angle of a center beamlet of said ion beam having a projection on said coordinate system, said projection forming a projection angle with said first axis;
        instructing said workpiece holder to rotate said workpiece thereby adjusting said workpiece orientation based on formed said projection angle;

instructing said ion beam source and said workpiece holder to match the relative motion of said ion beam and said workpiece to perform ion implantation of said workpiece using said ion beam;

instructing the workpiece holder to rotate said workpiece by an angle of p degrees around an axis perpendicular to both said first direction and second direction; and repeating said implantation and rotation steps (n-1) times such that the product of n and p (n×p) is equal to 360 degrees thereby completing the ion implantation process.

13. The ion implanter of claim 12, wherein when said ion implantation is completed, a dose uniformity is achieved throughout said workpiece.

14. The ion implanter of claim 12, wherein said first and second directions are perpendicular to each other.

15. The ion implanter of claim 12, wherein said predefined workpiece orientation is on said coordinate system and perpendicular to said first direction.

16. The ion implanter of claim 12, wherein said workpiece is a semiconductor substrate with pattern devices disposed thereon, and said workpiece orientation comprises an orientation of said pattern devices.

17. The ion implanter of claim 12, wherein said workpiece is a semiconductor substrate having a notch, and said workpiece orientation comprises an orientation of said notch.

18. The ion implanter of claim 12, wherein the step of adjusting said workpiece orientation comprises:

if the quotient of said projection angle divided by 45 degrees is equal to an even integer, then rotating said workpiece around an axis perpendicular to both said first direction and second direction such that said workpiece orientation changes by an angle within one of the following ranges, or any combination thereof: 30 to 60 degrees, 120 to 150 degrees, 210 to 240 degrees, or 300 to 330 degrees;

if the quotient of said projection angle divided by 45 degrees is equal to an odd integer, then leaving said workpiece orientation unchanged; and otherwise rotating said workpiece around an axis perpendicular to both said first direction and second direction such that said workpiece orientation changes by an angle of said projection angle plus an angle within one of the following ranges, or any combination thereof: 30 to 60 degrees, 120 to 150 degrees, 210 to 240 degrees, or 300 to 330 degrees.

19. The ion implanter of claim 12, wherein the step of adjusting said workpiece orientation comprises:

if the quotient of said projection angle divided by 45 degrees is equal to an even integer, then rotating said workpiece around an axis perpendicular to both said first direction and second direction such that said workpiece orientation changes by 45, 135, 225 or 315 degrees, or any combination thereof;

if the quotient of said projection angle divided by 45 degrees is equal to an odd integer, then leaving said workpiece orientation unchanged; and otherwise rotating said workpiece around an axis perpendicular to both said first direction and second direction such that said workpiece orientation changes by an angle of said projection angle plus 45, 135, 225 or 315 degrees.

20. The ion implanter of claim 12, wherein n is an integer equal to or greater than 2.

\* \* \* \* \*